US012592712B2

(12) United States Patent
Burnett et al.

(10) Patent No.: US 12,592,712 B2
(45) Date of Patent: Mar. 31, 2026

(54) SUPERCONDUCTING ANALOG-TO-DIGITAL CONVERTER (ADC) SYSTEM

(71) Applicant: NORTHROP GRUMMAN SYSTEMS CORPORATION, Falls Church, VA (US)

(72) Inventors: Randall M. Burnett, Catonsville, MD (US); Cody James Ballard, Catonsville, MD (US); Robert Miller, Hanover, MD (US); Tyler Derek Ram, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 147 days.

(21) Appl. No.: 18/511,401

(22) Filed: Nov. 16, 2023

(65) Prior Publication Data

US 2025/0167794 A1    May 22, 2025

(51) Int. Cl.
H03M 1/38 (2006.01)
H03K 3/38 (2006.01)
(Continued)

(52) U.S. Cl.
CPC .............. H03M 1/144 (2013.01); H03K 3/38 (2013.01); H03M 1/1245 (2013.01)

(58) Field of Classification Search
CPC ....... H03M 1/144; H03M 1/1245; H03K 3/38
(Continued)

(56) References Cited

U.S. PATENT DOCUMENTS

| | | | |
|---|---|---|---|
| 4,947,118 | A | 8/1990 | Fujimaki |
| 5,420,586 | A | 5/1995 | Radparvar |

(Continued)

FOREIGN PATENT DOCUMENTS

| | | |
|---|---|---|
| EP | 2308174 B1 | 3/2019 |
| JP | 2700649 B2 | 1/1998 |
| JP | 2711017 B2 | 2/1998 |

OTHER PUBLICATIONS

WOISR (Notification of Transmittal of The International Search Report and the Written Opinion of the International Searching Authority, or the Declaration), for PCT/US2024/053020, mailed Feb. 12, 2025.

*Primary Examiner* — Peguy Jean Pierre
(74) *Attorney, Agent, or Firm* — Tarolli, Sundheim, Covell & Tummino LLP

(57) ABSTRACT

One example includes a superconducting analog-to-digital converter (ADC) system. The system includes a control line configured to propagate an interrogation pulse and a superconducting quantum interference device (SQUID) comprising a first Josephson junction and a second Josephson junction. The SQUID can be configured to receive an input current. The first Josephson junction can be configured to trigger to provide a first pulse in response to the interrogation pulse and a first polarity of the input current and the second Josephson junction can be configured to trigger to generate a second pulse in response to the interrogation pulse and a second polarity of the input current. The system further includes an output stage configured to propagate the first pulse to an output to indicate the first polarity of the input current.

20 Claims, 4 Drawing Sheets

(51) Int. Cl.
    *H03M 1/12*          (2006.01)
    *H03M 1/14*          (2006.01)

(58) Field of Classification Search
    USPC ................................................. 341/133, 155
    See application file for complete search history.

(56)                References Cited

U.S. PATENT DOCUMENTS

| | | | |
|---|---|---|---|
| 6,483,339 B1 * | 11/2002 | Durand | H03K 19/1952 |
| | | | 327/368 |
| 9,646,682 B1 * | 5/2017 | Miller | G11C 7/06 |
| 10,103,735 B1 * | 10/2018 | Herr | H03K 17/92 |
| 10,797,684 B1 * | 10/2020 | Benz | H03K 3/38 |
| 11,486,910 B1 | 11/2022 | Ballard et al. | |
| 2008/0048762 A1 * | 2/2008 | Inamdar | H03K 17/92 |
| | | | 327/528 |
| 2024/0334844 A1 * | 10/2024 | Beck | G06N 10/40 |

* cited by examiner

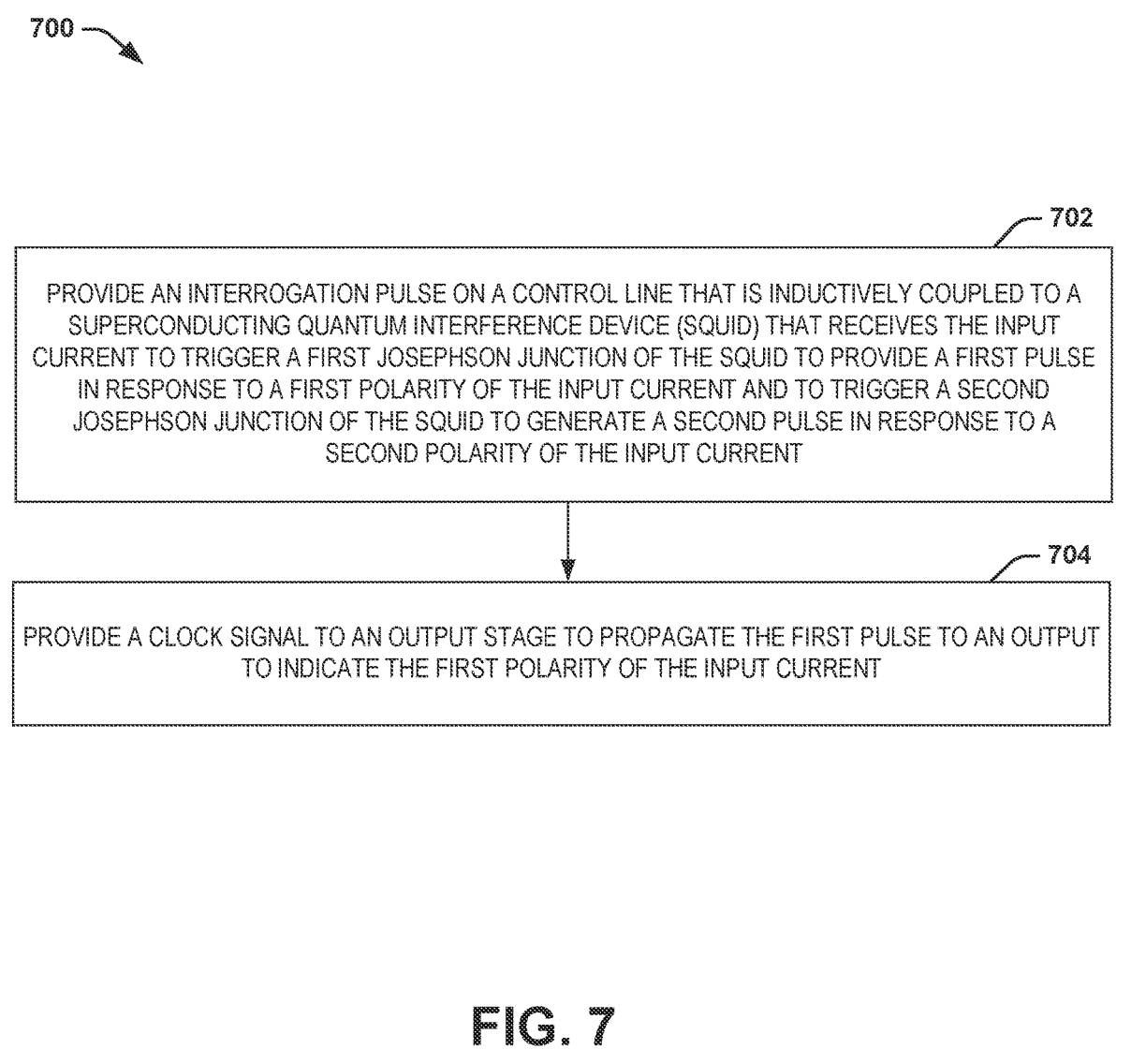

700 —

┌─────────────────────────────────────────────────────────────────────────────┐ ⌐ 702
│ PROVIDE AN INTERROGATION PULSE ON A CONTROL LINE THAT IS INDUCTIVELY COUPLED TO A │
│ SUPERCONDUCTING QUANTUM INTERFERENCE DEVICE (SQUID) THAT RECEIVES THE INPUT │
│ CURRENT TO TRIGGER A FIRST JOSEPHSON JUNCTION OF THE SQUID TO PROVIDE A FIRST PULSE │
│ IN RESPONSE TO A FIRST POLARITY OF THE INPUT CURRENT AND TO TRIGGER A SECOND │
│ JOSEPHSON JUNCTION OF THE SQUID TO GENERATE A SECOND PULSE IN RESPONSE TO A │
│ SECOND POLARITY OF THE INPUT CURRENT │
└─────────────────────────────────────────────────────────────────────────────┘

┌─────────────────────────────────────────────────────────────────────────────┐ ⌐ 704
│ PROVIDE A CLOCK SIGNAL TO AN OUTPUT STAGE TO PROPAGATE THE FIRST PULSE TO AN OUTPUT │
│ TO INDICATE THE FIRST POLARITY OF THE INPUT CURRENT │
└─────────────────────────────────────────────────────────────────────────────┘

FIG. 7

SUPERCONDUCTING ANALOG-TO-DIGITAL CONVERTER (ADC) SYSTEM

GOVERNMENT INTEREST

The invention was made under Government Contract. Therefore, the US Government has rights to the invention as specified in that contract.

TECHNICAL FIELD

The present invention relates generally to computer systems, and specifically to a superconducting analog-to-digital converter (ADC) system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 Kelvin.

Analog-to-digital converters (ADCs) are crucial components for computing technologies to implement logic functions. For example, ADCs are essential for both semiconductor-based and superconducting-based technology applications (computation, radar, sensors, communications, etc.) to convert analog information to digital information for processing. In many applications, the properties of ADCs can limit the overall device performance. As an example, superconducting ADCs can be especially attractive since their sensitivity and responsiveness metrics can be limited solely by fundamental constants and the magnetic flux response of associated Josephson junctions.

SUMMARY

One example includes a superconducting analog-to-digital converter (ADC) system. The system includes a control line configured to propagate an interrogation pulse and a superconducting quantum interference device (SQUID) comprising a first Josephson junction and a second Josephson junction. The SQUID can be configured to receive an input current. The first Josephson junction can be configured to trigger to provide a first pulse in response to the interrogation pulse and a first polarity of the input current and the second Josephson junction can be configured to trigger to generate a second pulse in response to the interrogation pulse and a second polarity of the input current. The system further includes an output stage configured to propagate the first pulse to an output to indicate the first polarity of the input current.

Another example includes a method for converting an input current to an output pulse. The method includes providing an interrogation pulse on a control line that is inductively coupled to a SQUID that receives the input current to trigger a first Josephson junction of the SQUID to provide a first pulse in response to a first polarity of the input current and to trigger a second Josephson junction of the SQUID to generate a second pulse in response to a second polarity of the input current. The method also includes providing a clock signal to an output stage to propagate the first pulse to an output to indicate the first polarity of the input current.

Another example includes a superconducting ADC system. The system includes a control line configured to propagate an interrogation pulse and a SQUID. The SQUID includes a first inductive coupling to the control line, a second inductive coupling to the control line, a first Josephson junction coupled to the first inductive coupling, and a second Josephson junction coupled to the second inductive coupling. The SQUID can be configured to receive an input current between the first and second inductive couplings such that the first Josephson junction is configured to trigger to provide a first pulse in response to the interrogation pulse and a first polarity of the input current and the second Josephson junction is configured to trigger to generate a second pulse in response to the interrogation pulse and a second polarity of the input current. The system further includes an output stage configured to propagate the first pulse to an output to indicate the first polarity of the input current.

BRIEF DESCRIPTION OF THE DRAWINGS

FIG. 7 illustrates an example of a method for converting an input current to an output pulse.

DETAILED DESCRIPTION

Figure 1:
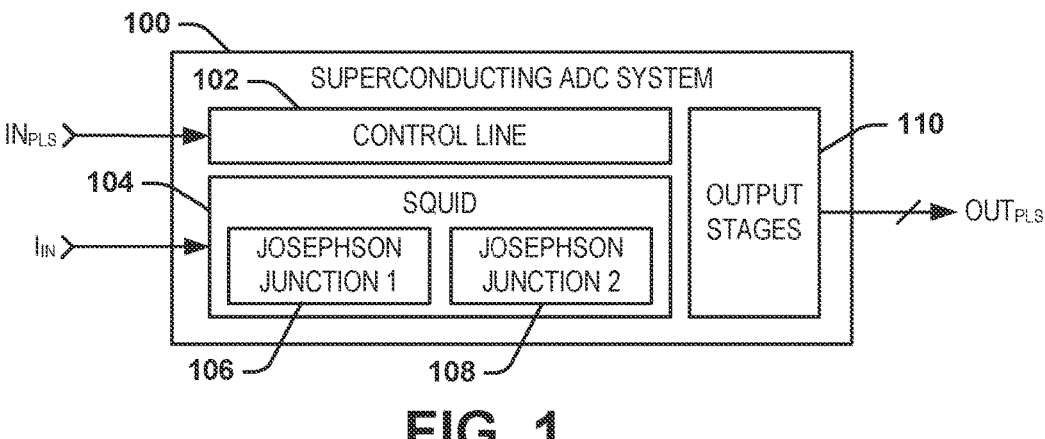
FIG. 1 illustrates an example block diagram of a superconducting ADC system.

The present invention relates generally to computer systems, and specifically to a superconducting analog-to-digital converter (ADC) system. As described herein, the superconducting ADC system can be configured to convert a polarity of a current to an output pulse (e.g., an RQL pulse) to operate as a single bit ADC. The superconducting ADC system includes a control line that is configured to propagate an interrogation pulse that is provided to read the polarity of the input current. The superconducting ADC system also includes a SQUID that is inductively coupled to the control line and which conducts the input current. The SQUID includes a pair of Josephson junctions that are biased by the input current (e.g., respective approximate equal portions of the input current).

The interrogation pulse induces a trigger current in the SQUID based on the inductive coupling of the SQUID to the control line. The trigger current combines with the input current to trigger one of the pair of Josephson junctions based on the polarity of the input current. For example, the SQUID can include a pair of inductive couplings to the control line, such that each of the inductive couplings can provide for the induced trigger current to be provided through each of the Josephson junctions in a first direction. The input current can be provided in the SQUID between the inductive couplings, such that the input current can be approximately equally provided through the Josephson junctions in either a first direction or a second direction opposite the first direction based on the polarity of the input current.

Therefore, in a first polarity of the input current, a first portion of the input current can be added to the trigger current through a first of the pair of Josephson junctions to trigger the first Josephson junction to generate a first pulse, and a second portion of the input current can be subtracted from the trigger current through a second of the pair of Josephson junctions to not trigger the second Josephson junction. Conversely, in a second polarity of the input current opposite the first polarity, the first portion of the input current can be subtracted from the trigger current through the first Josephson junction to not trigger the first Josephson junction, and the second portion of the input current can be added to the trigger current through the second Josephson junction to trigger the second Josephson junction to generate a second pulse. The first and second pulse can thus be indicative of the polarity of the input current.

The superconducting ADC system can also include a set of output stages to propagate the first and second pulses. The first pulse can be propagated on a first output stage to be provided to an output, such that the first pulse can be provided as an output pulse to indicate the first polarity of the input current. The second pulse can be propagated on a second output stage. As a first example, the second output stage can propagate the second pulse to a second output, such that the second pulse can indicate the second polarity of the input current. As a second example, the second output stage can be terminated, such that the absence of the first pulse on the first output stage can indicate the second polarity of the input current.

FIG. 1 illustrates an example block diagram of a superconducting ADC system 100. The superconducting ADC system 100 can be implemented in any of a variety of superconducting circuits to convert an analog signal to a digital signal. The superconducting ADC system 100 can be configured to convert a polarity of an input current $I_{IN}$ to an output pulse (e.g., an RQL pulse) $OUT_{PLS}$ to operate as a single bit ADC. Thus, multiple superconducting ADC systems 100 can be implemented for multi-bit ADC functionality.

The superconducting ADC system 100 includes a control line 102 that is configured to propagate an interrogation pulse $IN_{PLS}$ that is provided to read the polarity of the input current $I_{IN}$. The control line 102 can include and/or can be coupled to a Josephson transmission line (JTL) segment to propagate the interrogation pulse $IN_{PLS}$ via a clock signal (not shown). The superconducting ADC system 100 also includes a SQUID 104 that is inductively coupled to the control line 102 and which conducts the input current $I_{IN}$. As an example, the input current $I_{IN}$ can be provided from a current source, such as a SQUID from another superconducting loop. The SQUID 104 includes a first Josephson junction 106 and a second Josephson junction 108 that are biased by the input current $I_{IN}$. As described in greater detail herein, the input current $I_{IN}$ can be split into approximate equal portions that are each provided through a respective one of the Josephson junctions 106 and 108.

For example, the SQUID 104 can include a pair of inductive couplings to the control line 102, with each of the inductive couplings being coupled to a respective one of the Josephson junctions 106 and 108. Therefore, the interrogation pulse $IN_{PLS}$ can induce a trigger current through each of the Josephson junctions 106 and 108 in a specific direction (e.g., in a loop around the SQUID 104). The input current $I_{IN}$ can be provided in the SQUID 104 between the inductive couplings, such that the portions of the input current $I_{IN}$ can be approximately equally provided through the Josephson junctions 106 and 108 in either a first direction or a second direction opposite the first direction based on the polarity of the input current $I_{IN}$. In this manner, the trigger current combines with the input current $I_{IN}$ in the SQUID 104 to trigger one of the Josephson junctions 106 and 108 based on the polarity of the input current $I_{IN}$.

As an example, in a first polarity of the input current $I_{IN}$, a first portion of the input current $I_{IN}$ can be added to the trigger current through the first Josephson junction 106 to trigger the first Josephson junction 106 to generate a first pulse, and a second portion of the input current $I_{IN}$ can be subtracted from the trigger current through the second Josephson junction 108 to not trigger the second Josephson junction 108. Conversely, in a second polarity of the input current $I_{IN}$ opposite the first polarity, the first portion of the input current $I_{IN}$ can be subtracted from the trigger current through the first Josephson junction 106 to not trigger the first Josephson junction 106, and the second portion of the input current $I_{IN}$ can be added to the trigger current through the second Josephson junction 108 to trigger the second Josephson junction 108 to generate a second pulse. The first and second pulse can thus be indicative of the polarity of the input current $I_{IN}$.

The superconducting ADC system 100 further includes a set of output stages 110 to propagate the first and second pulses (e.g., via respective JTL segments). The output stages 110 can include a first output stage to propagate the first pulse to an output to provide the output pulse $OUT_{PLS}$. The presence of the output pulse $OUT_{PLS}$ can thus indicate the first polarity of the input current $I_{IN}$. The output stages 110 can also include a second output stage to propagate the second pulse. As a first example, the second output stage can propagate the second pulse to a second output to provide the second pulse as a second output pulse (not shown), the presence of which being indicative of the second polarity of the input current $I_{IN}$. As a second example, the second output stage can be terminated, such that the absence of the output pulse $OUT_{PLS}$ can indicate the second polarity of the input current $I_{IN}$. In either example, the output pulse $OUT_{PLS}$ can be indicative of the polarity of the input current $I_{IN}$.

Figure 2:
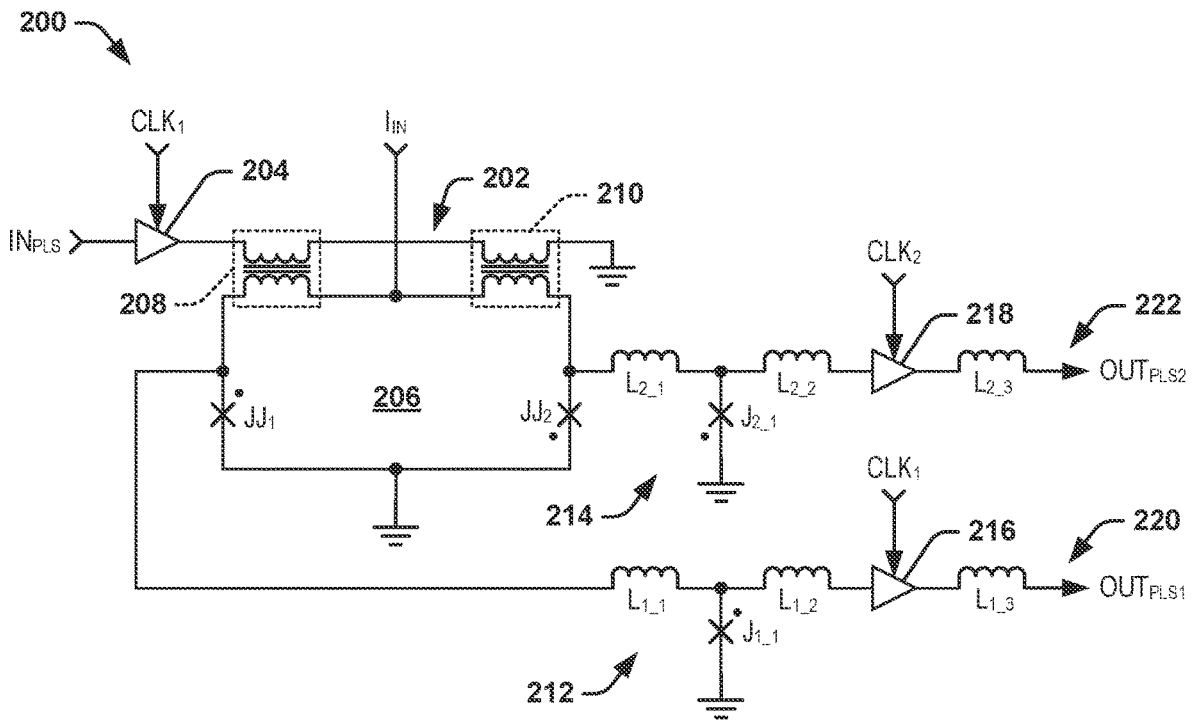
FIG. 2 illustrates an example circuit diagram of a superconducting ADC system.

FIG. 2 illustrates an example circuit diagram of a superconducting ADC system 200. The superconducting ADC system 200 can correspond to an example of the superconducting ADC system 100 in the example of FIG. 1, and can thus likewise be configured to convert a polarity of an input current $I_{IN}$ to an output pulse (e.g., an RQL pulse) $OUT_{PLS}$ to operate as a single bit ADC.

The superconducting ADC system 200 includes a control line 202 that is configured to propagate an interrogation pulse $IN_{PLS}$ that is provided to read the polarity of the input current $I_{IN}$. The control line 202 includes a JTL segment 204 that is biased by a clock signal (e.g., an RQL clock signal comprising an in-phase component and a quadrature-phase component), demonstrated as clock signal $CLK_1$ to designate a specific phase of the clock signal CLK. Thus, the interrogation pulse $IN_{PLS}$ is propagated to the superconducting ADC system 200 at the specific phase of the clock signal $CLK_1$. The superconducting ADC system 200 also includes a SQUID 206 that is inductively coupled to the control line 202 via a first inductive coupling 208 and a second inductive coupling 210. The SQUID 206 is configured to receive the input current $I_{IN}$, such as from a SQUID from another superconducting loop. The SQUID 206 includes a first Josephson junction $JJ_1$ and a second Josephson junction $JJ_2$ that are biased by the input current $I_{IN}$. In the example of FIG. 2, the input current $I_{IN}$ is provided to the SQUID 206 between the inductive couplings 208 and 210, and is therefore split into approximate equal portions through a respective one of the Josephson junctions $JJ_1$ and $JJ_2$. As described in greater detail herein, the first Josephson junction $JJ_1$ and the second Josephson junction $JJ_2$ are intended to trigger at opposite polarities with respect to each other in the SQUID 206, as indicated by the polarity dot designators.

As described above in the example of FIG. 1, the interrogation pulse $IN_{PLS}$ can induce a trigger current through each of the Josephson junctions $JJ_1$ and $JJ_2$ in a specific direction (e.g., in a loop around the SQUID 206), and the input current $I_{IN}$ can be provided in approximately equal portions through the Josephson junctions $JJ_1$ and $JJ_2$ in either a first direction or a second direction opposite the first direction based on the polarity of the input current $I_{IN}$. In this manner, the trigger current combines with the input current $I_{IN}$ in the SQUID 206 to trigger one of the Josephson junctions $JJ_1$ and $JJ_2$ based on the polarity of the input current $I_{IN}$. As described in greater detail herein, the first Josephson junction $JJ_1$ can trigger to provide a first pulse, or the second Josephson junction can trigger to provide a second pulse.

The superconducting ADC system 200 further includes a first output stage 212 and a second output stage 214. The first output stage 212 is coupled to the first Josephson junction $JJ_1$ and is configured to propagate the first pulse via the first phase of the clock signal $CLK_1$. The first output stage 212 includes a first inductor $L_{1\_1}$, a Josephson junction $J_{1\_1}$, a second inductor $L_{1\_2}$, a JTL segment 216, and a third inductor $L_{1\_3}$ through which the first pulse can propagate at the first phase of the clock signal $CLK_1$ (e.g., by triggering the Josephson junction $J_{1\_1}$ via a combination of the first pulse and the bias provided by the first phase of the clock signal $CLK_1$). The second output stage 214 is coupled to the second Josephson junction $JJ_2$ and is configured to propagate the second pulse via a second phase of the clock signal $CLK_2$. The second output stage 214 includes a first inductor $L_{2\_1}$, a Josephson junction $J_{2\_1}$, a second inductor $L_{2\_2}$, a JTL segment 218, and a third inductor $L_{2\_3}$ through which the second pulse can propagate at the second phase of the clock signal $CLK_2$ (e.g., by triggering the Josephson junction $J_{2\_1}$ via a combination of the second pulse and the bias provided by the second phase of the clock signal $CLK_2$). As described in greater detail herein, the second pulse can be generated as a negative pulse, such that the second phase of the clock signal $CLK_2$ can be provided as a negative bias (e.g., approximately 180° out-of-phase of the first phase of the clock signal $CLK_1$) and DC bias of opposite polarity.

In the example of FIG. 2, the first output stage 212 is configured to provide the first pulse as a first output pulse $OUT_{PLS1}$ at a first output 220 to indicate the first polarity of the input current $I_{IN}$ and the second output stage 214 is configured to provide the second pulse as a second output pulse $OUT_{PLS2}$ at a second output 222 to indicate the second polarity of the input current $I_{IN}$. As described above, instead of the second pulse being provided as a second output pulse $OUT_{PLS2}$, the second output stage 214 could instead be terminated, such that the absence of the output pulse $OUT_{PLS1}$ can indicate the second polarity of the input current $I_{IN}$.

Figure 3:
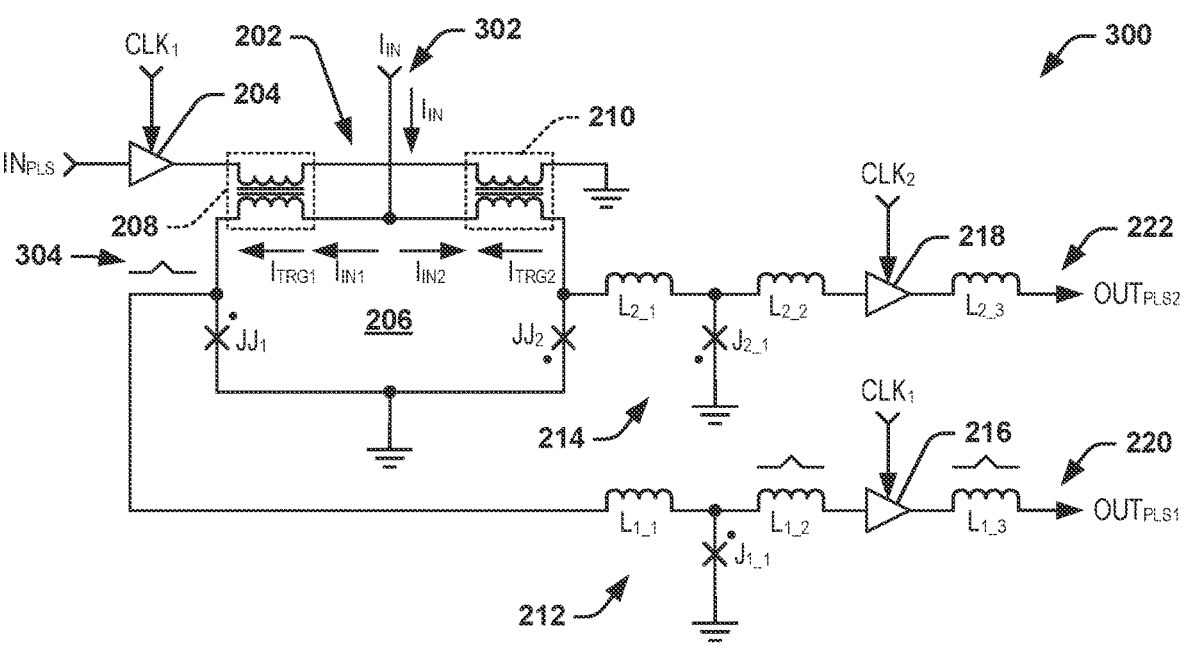
FIG. 3 illustrates a first example diagram of converting an input current to an output pulse by a superconducting ADC system.

FIG. 3 illustrates a first example diagram 300 of converting an input current to an output pulse by the superconducting ADC system 200. The diagram 300 demonstrates the superconducting ADC system 200. Therefore, reference is to be made to the example of FIG. 2 in the following description of the example of FIG. 3.

The diagram 300 demonstrates that the input current $I_{IN}$ has a first polarity, in which the input current $I_{IN}$ is provided to the SQUID 206 (e.g., from a SQUID), such that the input current $I_{IN}$ flows from a terminal 302 through the SQUID 206 to ground. The input current $I_{IN}$ is split into a first portion $I_{IN1}$ that is provided through the first Josephson junction $JJ_1$ and a second portion $I_{IN2}$ that is provided through the second Josephson junction $JJ_2$. The first and second portions $I_{IN1}$ and $I_{IN2}$ can be approximately equal, and are demonstrated as propagating around the SQUID 206 in opposite orientations based on the input current $I_{IN}$ being provided in a symmetrical manner through the SQUID 206. Particularly, in the example of FIG. 3, the first portion $I_{IN1}$ is provided in a counter-clockwise manner in the SQUID 206 and the second portion $I_{IN2}$ is provided in a clockwise manner in the SQUID 206.

On the first phase of the clock signal $CLK_1$, the interrogation pulse $IN_{PLS}$ is provided on the control line 202. Therefore, the trigger current is induced in the SQUID 206 via the inductive couplings 208 and 210. In the example of FIG. 3, the trigger current is demonstrated as a first trigger current $I_{TRG1}$ that is induced by the inductive coupling 208 and as a second trigger current $I_{TRG2}$ that is induced by the inductive coupling 210. The first trigger current $I_{TRG1}$ thus flows through the first Josephson junction $JJ_1$ and the second trigger current $I_{TRG2}$ thus flows through the second Josephson junction $JJ_2$. The first and second trigger currents $I_{TRG1}$ and $I_{TRG2}$ are demonstrated as being provided in the same counter-clockwise orientation in the SQUID 206.

Based on the arrangement of the input current $I_{IN}$ and the inductive couplings 208 and 210 with respect to the SQUID 206, the portions $I_{IN1}$ and $I_{IN2}$ of the input current $I_{IN}$ are positively and negatively added to each other through each of the Josephson junctions $JJ_1$ and $JJ_2$ to trigger one of the Josephson junctions $JJ_1$ and $JJ_2$ based on the polarity of the input current $I_{IN}$. In the example of FIG. 3, based on the first polarity of the input current $I_{IN}$, the first portion of the input current $I_{IN1}$ is added to the first trigger current $I_{TRG1}$ based on the first portion of the input current $I_{IN1}$ and the first trigger current $I_{TRG1}$ propagating in the same direction (e.g., counter-clockwise) in the SQUID 206. Therefore, the addition of the first portion of the input current $I_{IN1}$ and the first trigger current $I_{TRG1}$ through the first Josephson junction 106 is sufficient to trigger the first Josephson junction $JJ_1$ to generate a first pulse, demonstrated at 304. Conversely, the second portion of the input current $I_{IN2}$ is subtracted from the second trigger current $I_{TRG2}$ based on the second portion of the input current $I_{IN2}$ and the second trigger current $I_{TRG2}$ propagating in opposite directions in the SQUID 206. Therefore, the opposite polarity combination of the second portion of the input current $I_{IN2}$ and the second trigger current $I_{TRG2}$ through the second Josephson junction $JJ_2$ is insufficient to trigger the second Josephson junction $JJ_2$.

The first pulse 304 propagates through the first output stage 212 at the first phase of the clock signal $CLK_1$ and is provided at the first output 220 as the first output pulse $OUT_{PLS1}$. Therefore, the presence of the first output pulse $OUT_{PLS1}$ is indicative of the first polarity of the input current $I_{IN}$.

Figure 4:
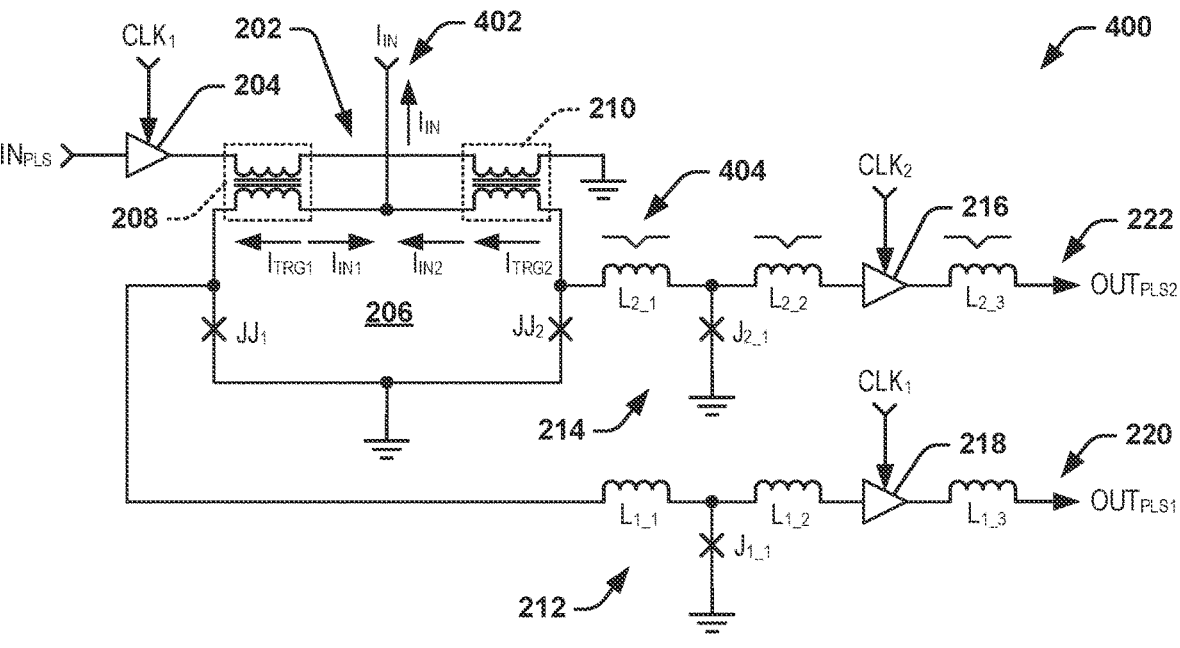
FIG. 4 illustrates a second example diagram of converting an input current to an output pulse by a superconducting ADC system.

FIG. 4 illustrates a first example diagram 400 of converting an input current to an output pulse by the superconducting ADC system 200. The diagram 400 demonstrates the superconducting ADC system 200. Therefore, reference is to be made to the example of FIG. 2 in the following description of the example of FIG. 4.

The diagram 400 demonstrates that the input current $I_{IN}$ has a second polarity, in which the input current $I_{IN}$ is provided from the SQUID 206 (e.g., from a SQUID), such that the input current $I_{IN}$ flows from ground through the SQUID 206 to a terminal 402. Similar to as described above, in the example of FIG. 4, the input current $I_{IN}$ is split into the first portion $I_{IN1}$ that is provided through the first Josephson junction $JJ_1$ and the second portion $I_{IN2}$ that is provided through the second Josephson junction $JJ_2$. The first and second portions $I_{IN1}$ and $I_{IN2}$ can be approximately equal, and are demonstrated as propagating around the SQUID 206 in opposite orientations based on the input current $I_{IN}$ being provided in a symmetrical manner through the SQUID 206. Particularly, in the example of FIG. 4, the first portion $I_{IN1}$ is provided in a clockwise manner in the SQUID 206 and the second portion $I_{IN2}$ is provided in a counter-clockwise manner in the SQUID 206, and thus opposite the orientations in the example of FIG. 3 based on the opposite polarity of the input current $I_{IN}$.

On the first phase of the clock signal $CLK_1$, the interrogation pulse $IN_{PLS}$ is provided on the control line 202. Therefore, the first trigger current $I_{TRG1}$ induced by the inductive coupling 208 is provided through the first Josephson junction $JJ_1$ and the second trigger current $I_{TRG2}$ induced by the inductive coupling 210 is provided through the second Josephson junction $JJ_2$. The first and second trigger currents $I_{TRG1}$ and $I_{TRG2}$ are demonstrated as being provided in the same counter-clockwise orientation in the SQUID 206, similar to as demonstrated in the example of FIG. 3.

In the example of FIG. 4, based on the second polarity of the input current $I_{IN}$, the first portion of the input current $I_{IN1}$ is subtracted from the first trigger current $I_{TRG1}$ based on the first portion of the input current $I_{IN1}$ and the first trigger current $I_{TRG1}$ propagating in the opposite directions in the SQUID 206. Therefore, the opposite polarity combination of the first portion of the input current $I_{IN1}$ and the first trigger current $I_{TRG1}$ through the first Josephson junction 106 is insufficient to trigger the first Josephson junction $JJ_1$. Conversely, the second portion of the input current $I_{IN2}$ is added to the second trigger current $I_{TRG2}$ based on the second portion of the input current $I_{IN2}$ and the second trigger current $I_{TRG2}$ propagating in the same direction (e.g., counter-clockwise) in the SQUID 206. Therefore, the addition of the second portion of the input current $I_{IN2}$ and the second trigger current $I_{TRG2}$ through the second Josephson junction $JJ_2$ is sufficient to trigger the second Josephson junction $JJ_2$ to generate a second pulse, demonstrated at 404. Because of the orientation of the second portion of the input current $I_{IN2}$ and the second trigger current $I_{TRG2}$ and the polarity of the second Josephson junction $JJ_2$, the second Josephson junction $JJ_2$ triggers to generate the second pulse 404 as a negative pulse.

The second pulse 404 propagates through the second output stage 214 at the second phase of the clock signal $CLK_2$ and is provided at the second output 222 as the second output pulse $OUT_{PLS2}$. Therefore, the presence of the second output pulse $OUT_{PLS2}$ is indicative of the second polarity of the input current $I_I$. Similar to as described above, one of the outputs 220 and 222 can be terminated, such that the absence of the pulse at the other one of the outputs 220 and 222 can be indicative of the opposite polarity of the input current $I_{IN}$.

Figure 5:
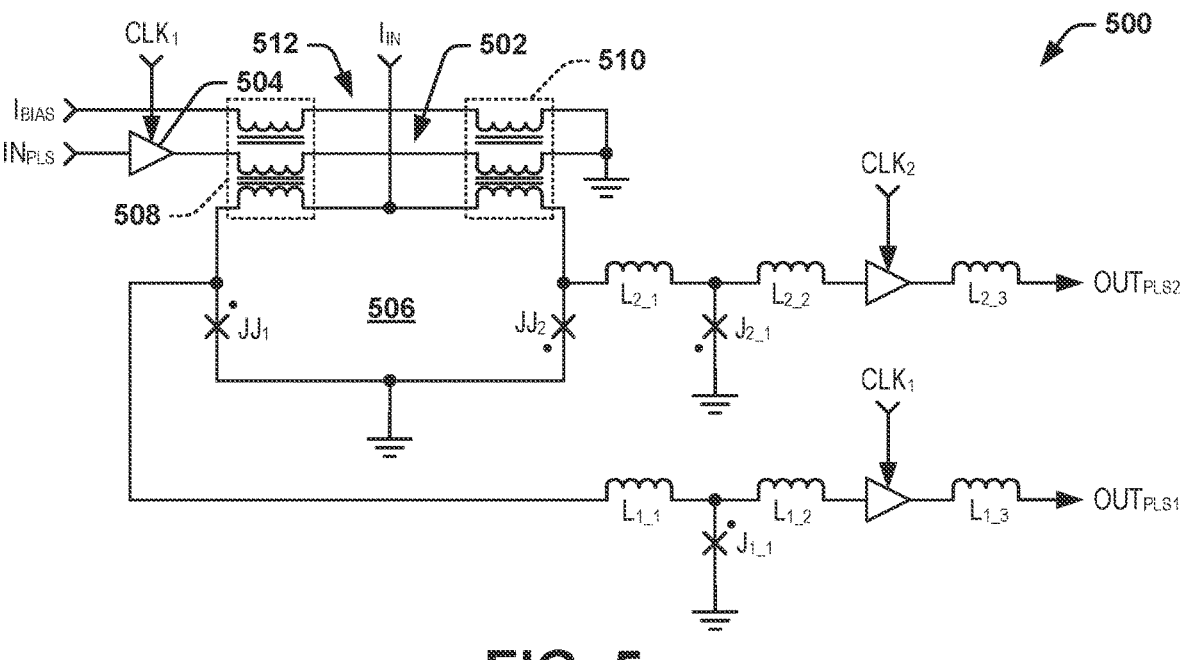
FIG. 5 illustrates another example of a superconducting ADC system.

FIG. 5 illustrates another example of a superconducting ADC system 500. The superconducting ADC system 500 can correspond to another example of the superconducting ADC system 100. Therefore, reference is to be made to the example of FIG. 1 in the following description of the example of FIG. 5.

The superconducting ADC system 500 includes a control line 502 that is configured to propagate an interrogation pulse $IN_{PLS}$ that is provided to read the polarity of the input current $I_{IN}$. The control line 502 includes a JTL segment 504 that is biased by a clock signal (e.g., an RQL clock signal comprising an in-phase component and a quadrature-phase component), demonstrated as clock signal $CLK_1$ to designate a specific phase of the clock signal CLK. Thus, the interrogation pulse $IN_{PLS}$ is propagated to the superconducting ADC system 500 at the specific phase of the clock signal $CLK_1$. The superconducting ADC system 500 also includes a SQUID 506 that is inductively coupled to the control line 502 via a first inductive coupling 508 and a second inductive coupling 510. The SQUID 506 is configured to receive the input current $I_{IN}$, and includes a first Josephson junction $JJ_1$ and a second Josephson junction $JJ_2$ that are biased by the input current $I_{IN}$. The SQUID 506 is thus configured the same as the SQUID 206 in the example of FIG. 2.

The superconducting ADC system 500 also includes a DC bias line 512 that, along with the control line 502, is inductively coupled to the SQUID 506. The DC bias line 512 is configured to propagate a DC bias current $I_{BIAS}$, such that the current $I_{BIAS}$ induces a bias current in the SQUID 506 via the inductive couplings 508 and 510. The induced bias current in the SQUID 506 can thus have the same orientation in the SQUID 506 as the trigger currents that are induced by the interrogation pulse $IN_{PLS}$ via the inductive couplings 508 and 510. The addition of the DC bias line 512 can provide for additional biasing of the Josephson junctions $JJ_1$ and $JJ_2$. As a result, the amplitude of the interrogation pulse $IN_{PLS}$, and thus the induced trigger currents, can be less in the superconducting ADC system 500 relative to the superconducting ADC system 200. Accordingly, by providing the interrogation pulse $IN_{PLS}$ at a smaller amplitude, power savings and efficiency can be achieved in the superconducting ADC system 500 relative to the superconducting ADC system 200.

The superconducting ADC system 500 otherwise operates the same as the superconducting ADC system 200. Accordingly, in response to the first polarity of the input current $I_{IN}$, the first Josephson junction $JJ_1$ triggers in response to the sum of the first portion of the input current $I_{IN}$, the first trigger current, and the induced bias current to generate the first pulse, and the second Josephson junction $JJ_2$ does not trigger in response to the second portion of the input current $I_{IN}$ being subtracted from the sum of the first trigger current and the induced bias current. Conversely, in response to the second polarity of the input current $I_{IN}$, the first Josephson junction $JJ_1$ does not trigger in response to the second portion of the input current $I_{IN}$ being subtracted from the sum of the first trigger current and the induced bias current, and the second Josephson junction $JJ_2$ triggers in response to the sum of the second portion of the input current $I_{IN}$, the first trigger current, and the induced bias current to generate the second pulse.

Figure 6:
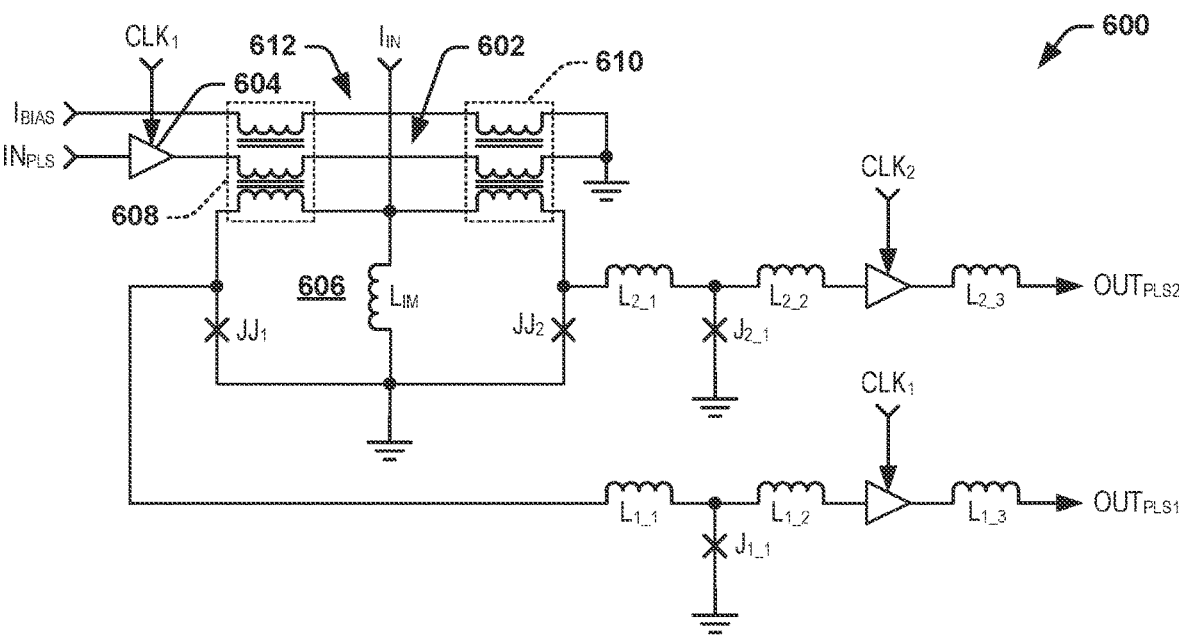
FIG. 6 illustrates yet another example of a superconducting ADC system.

FIG. 6 illustrates yet another example of a superconducting ADC system 600. The superconducting ADC system 600 can correspond to another example of the superconducting ADC system 100. Therefore, reference is to be made to the example of FIG. 1 in the following description of the example of FIG. 6.

The superconducting ADC system 600 includes a control line 602 that is configured to propagate an interrogation pulse $IN_{PLS}$ that is provided to read the polarity of the input current $I_{IN}$. The control line 602 includes a JTL segment 604 that is biased by a clock signal (e.g., an RQL clock signal comprising an in-phase component and a quadrature-phase component), demonstrated as clock signal CLK₁ to designate a specific phase of the clock signal CLK. Thus, the interrogation pulse IN_PLS is propagated to the superconducting ADC system 600 at the specific phase of the clock signal CLK₁. The superconducting ADC system 600 also includes a SQUID 606 that is inductively coupled to the control line 602 via a first inductive coupling 608 and a second inductive coupling 610. The SQUID 606 is configured to receive the input current I_IN, and includes a first Josephson junction JJ₁ and a second Josephson junction JJ₂ that are biased by the input current I_IN.

The SQUID 606 further includes a shunt inductor L_SHNT that extends through the SQUID 606 to provide symmetry of the SQUID 606 on both sides of the shunt inductor L_SHNT. In the example of FIG. 6, the shunt inductor L_SHNT is arranged between the inductive couplings 608 and 610 and between the first and second Josephson junctions JJ₁ and JJ₂. The shunt inductor L_SHNT is configured to provide noise suppression with respect to the current line on which the input current I_IN is provided. As described above, the input current I_IN can be provided from a SQUID. The shunt inductor L_SHNT can thus operate as a filter to suppress the potential effects of the first and second pulses on the current source (e.g., the SQUID), thereby providing greater impedance matching between the SQUID 606 and the current source.

The superconducting ADC system 600 also includes a DC bias line 612 that, along with the control line 602, is inductively coupled to the SQUID 606. The DC bias line 612 is configured to propagate a DC bias current I_BIAS, such that the current I_BIAS induces a bias current in the SQUID 606 via the inductive couplings 608 and 610. The induced bias current in the SQUID 606 can thus have the same orientation in the SQUID 606 as the trigger currents that are induced by the interrogation pulse IN_PLS via the inductive couplings 608 and 610. The addition of the DC bias line 612 can provide for additional biasing of the Josephson junctions JJ₁ and JJ₂. As a result, the amplitude of the interrogation pulse IN_PLS, and thus the induced trigger currents, can be less in the superconducting ADC system 600 relative to the superconducting ADC system 200. Accordingly, by providing the interrogation pulse IN_PLS at a smaller amplitude, power savings and efficiency can be achieved in the superconducting ADC system 600 relative to the superconducting ADC system 200.

The superconducting ADC system 600 otherwise operates the same as the superconducting ADC system 200. Accordingly, in response to the first polarity of the input current I_IN, the first Josephson junction JJ₁ triggers in response to the sum of the first portion of the input current I_IN, the first trigger current, and the induced bias current to generate the first pulse, and the second Josephson junction JJ₂ does not trigger in response to the second portion of the input current I_IN being subtracted from the sum of the first trigger current and the induced bias current. Conversely, in response to the second polarity of the input current I_IN, the first Josephson junction JJ₁ does not trigger in response to the second portion of the input current I_IN being subtracted from the sum of the first trigger current and the induced bias current, and the second Josephson junction JJ₂ triggers in response to the sum of the second portion of the input current I_IN, the first trigger current, and the induced bias current to generate the second pulse.

In view of the foregoing structural and functional features described above, a methodology in accordance with various aspects of the disclosure will be better appreciated with reference to FIG. 7. It is to be understood and appreciated that the method of FIG. 7 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 7 illustrates an example of a method 700 for converting an input current (e.g., the input current I_IN) to an output pulse (e.g., the output pulse OUT_PLS). At 702, an interrogation pulse (e.g., the interrogation pulse IN_PLS) is provided on a control line (e.g., the control line 102) that is inductively coupled to a SQUID (e.g., the SQUID 104) that receives the input current to trigger a first Josephson junction (e.g., the first Josephson junction 106) of the SQUID to provide a first pulse (e.g., the first pulse 304) in response to a first polarity of the input current and to trigger a second Josephson junction (e.g., the second Josephson junction 108) of the SQUID to generate a second pulse (e.g., the second pulse 404) in response to a second polarity of the input current. At 704, a clock signal (e.g., the first phase of the clock signal CLK₁) is provided to an output stage (e.g., the output stages 110) to propagate the first pulse to an output (e.g., the first output 220) to indicate the first polarity of the input current.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting analog-to-digital converter (ADC) system comprising:
   a control line configured to propagate an interrogation pulse;
   a superconducting quantum interference device (SQUID) comprising a first Josephson junction and a second Josephson junction, the SQUID being configured to receive an input current, the first Josephson junction being configured to trigger to provide a first pulse in response to the interrogation pulse and a first polarity of the input current, the second Josephson junction being configured to trigger to generate a second pulse in response to the interrogation pulse and a second polarity of the input current; and
   an output stage configured to propagate the first pulse to an output to indicate the first polarity of the input current.

2. The system of claim 1, wherein the control line is inductively coupled to the SQUID, such that the interrogation pulse induces a trigger current in the SQUID, wherein the input current is split into a first portion that biases the first Josephson junction and a second portion that biases the second Josephson junction.

3. The system of claim 2, wherein the first portion of the input current is added to the trigger current to trigger the first Josephson junction and the second portion of the input current is subtracted from the trigger current to not trigger the second Josephson junction in response to the first polarity of the input current, wherein the first portion of the input current is subtracted from the trigger current to not trigger the first Josephson junction and the second portion of the input current is added to the trigger current to trigger the second Josephson junction in response to the second polarity of the input current.

4. The system of claim 2, wherein the SQUID comprises a first inductive coupling to the control line and a second inductive coupling to the control line, the first inductive coupling being coupled to the first Josephson junction and the second inductive coupling being coupled to the second Josephson junction, wherein the input current is provided between the first and second inductive couplings.

5. The system of claim 1, further comprising a DC bias line configured to propagate a DC bias current, wherein the SQUID is inductively coupled to the DC bias line to inductively provide a DC bias current in the SQUID.

6. The system of claim 1, wherein the input current is provided to the SQUID on a current line, wherein the SQUID further comprises a shunt inductor arranged between the first and second Josephson junctions to provide noise suppression with respect to the current line.

7. The system of claim 1, wherein the output stage is a first output stage, the system further comprising a second output stage configured to propagate the second pulse.

8. The system of claim 7, wherein the output is a first output, wherein the second output stage is configured to propagate the second pulse to a second output to indicate the second polarity of the input current.

9. The system of claim 7, wherein the second output stage is terminated, such that an absence of the first pulse at the output indicates the second polarity of the input current.

10. The system of claim 7, wherein the second Josephson junction is configured to trigger to generate the second pulse as a negative pulse in response to the interrogation pulse and a second polarity of the input current, wherein the first output stage comprises a first Josephson transmission line (JTL) segment and the second output stage comprises a second JTL segment, wherein the second JTL segment is biased by a clock signal that is 180° out-of-phase of the clock signal that is configured to bias the first JTL segment and a DC bias that is of opposite polarity to that of the first JTL segment.

11. A method for converting an input current to an output pulse, the method comprising:

providing an interrogation pulse on a control line that is inductively coupled to a superconducting quantum interference device (SQUID) that receives the input current to trigger a first Josephson junction of the SQUID to provide a first pulse in response to a first polarity of the input current and to trigger a second Josephson junction of the SQUID to generate a second pulse in response to a second polarity of the input current; and providing a clock signal to an output stage to propagate the first pulse to an output to indicate the first polarity of the input current.

12. The method of claim 11, wherein the input current is split into a first portion that biases the first Josephson junction and a second portion that biases the second Josephson junction, wherein providing the interrogation pulse on the control line comprises inducing a trigger current in the SQUID, such that the first portion of the input current is added to the trigger current to trigger the first Josephson junction and the second portion of the input current is subtracted from the trigger current to not trigger the second Josephson junction in response to the first polarity of the input current, and such that the first portion of the input current is subtracted from the trigger current to not trigger the first Josephson junction and the second portion of the input current is added to the trigger current to trigger the second Josephson junction in response to the second polarity of the input current.

13. The method of claim 12, wherein the SQUID comprises a first inductive coupling to the control line and a second inductive coupling to the control line, the first inductive coupling being coupled to the first Josephson junction and the second inductive coupling being coupled to the second Josephson junction, wherein the input current is provided between the first and second inductive couplings.

14. The method of claim 11, wherein the output stage is a first output stage, wherein providing the clock signal comprises providing a first phase of the clock signal to a first Josephson transmission line (JTL) segment of the first output stage to propagate the first pulse, the method further comprising providing a second phase of the clock signal that is 180° out-of-phase of the first phase and with opposite DC polarity to a second JTL segment of the second output stage to propagate the second pulse.

15. The method of claim 14, wherein the output is a first output, wherein the second output stage is configured to propagate the second pulse to a second output to indicate the second polarity of the input current.

16. A superconducting analog-to-digital converter (ADC) system comprising:

a control line configured to propagate an interrogation pulse;

a superconducting quantum interference device (SQUID) comprising:

a first inductive coupling to the control line;

a second inductive coupling to the control line;

a first Josephson junction coupled to the first inductive coupling; and a second Josephson junction coupled to the second inductive coupling, the SQUID being configured to receive an input current between the first and second inductive couplings such that the first Josephson junction is configured to trigger to provide a first pulse in response to the interrogation pulse and a first polarity of the input current and the second Josephson junction is configured to trigger to generate a second pulse in response to the interrogation pulse and a second polarity of the input current; and an output stage configured to propagate the first pulse to an output to indicate the first polarity of the input current.

17. The system of claim 16, wherein the interrogation pulse provided on the control line induces a trigger current in the SQUID, wherein the input current is split into a first portion that biases the first Josephson junction and a second portion that biases the second Josephson junction, wherein the first portion of the input current is added to the trigger current to trigger the first Josephson junction and the second portion of the input current is subtracted from the trigger current to not trigger the second Josephson junction in response to the first polarity of the input current, wherein the first portion of the input current is subtracted from the trigger current to not trigger the first Josephson junction and the second portion of the input current is added to the trigger current to trigger the second Josephson junction in response to the second polarity of the input current.

18. The system of claim 16, further comprising a DC bias line configured to propagate a DC bias current, wherein the SQUID is inductively coupled to the DC bias line to inductively provide a DC bias current in the SQUID.

19. The system of claim 16, wherein the input current is provided to the SQUID on a current line, wherein the SQUID further comprises a shunt inductor arranged between the first and second Josephson junctions to provide noise suppression with respect to the current line.

20. The system of claim 16, wherein the output stage is a first output stage, the system further comprising a second output stage configured to propagate the second pulse, the second output stage comprising one of a second output to indicate the second polarity of the input current or a termination such that an absence of the first pulse at the output indicates the second polarity of the input current.

\* \* \* \* \*